(12) United States Patent
Kuroda et al.

(10) Patent No.: US 7,042,008 B2
(45) Date of Patent: May 9, 2006

(54) IMAGE SENSOR AND METHOD OF MANUFACTURING THE SAME

(75) Inventors: Yoshikatsu Kuroda, Aichi-ken (JP); Tadayuki Takahashi, Kanagawa-ken (JP); Yasushi Mizuno, Kanagawa-ken (JP)

(73) Assignees: Mitsubishi Heavy Industries, Ltd., Tokyo (JP); Japan as represented by the Director-General of the Institute of Space and Astronautical Science, Kanagawa (JP)

( * ) Notice: Subject to any disclaimer, the term of this patent is extended or adjusted under 35 U.S.C. 154(b) by 77 days.

(21) Appl. No.: 10/636,616

(22) Filed: Aug. 8, 2003

(65) Prior Publication Data
US 2004/0026758 A1    Feb. 12, 2004

Related U.S. Application Data

(63) Continuation of application No. PCT/JP02/11524, filed on Nov. 5, 2002.

(30) Foreign Application Priority Data
Nov. 5, 2001    (JP) .............................. 2001-339711

(51) Int. Cl.
    *H01L 31/0376*    (2006.01)
(52) U.S. Cl. .......................................... 257/53; 257/59
(58) Field of Classification Search ................. 257/53, 257/59
See application file for complete search history.

(56) References Cited

FOREIGN PATENT DOCUMENTS

| | | |
|---|---|---|
| JP | 8-115946 | 5/1996 |
| JP | 8-160147 | 6/1996 |
| JP | 8-213425 | 8/1996 |
| JP | 10-22337 | 1/1998 |
| JP | 2000-58807 | 2/2000 |
| JP | 2001-291853 | 10/2001 |
| JP | 2002-311146 | 10/2002 |

OTHER PUBLICATIONS

Tadayuki Takahashi et al., "Recent Progress in CdTe and CdZnTe Detectors", IEEE Transactions on Nuclear Science, vol. 48, No. 4, Aug. 4, 2001, pp. 950-959.

*Primary Examiner*—Douglas W Owens
(74) *Attorney, Agent, or Firm*—Wenderoth, Lind & Ponack, L.L.P.

(57) ABSTRACT

An image sensor has a CdTe plate, a plurality of hole-type electrodes, and a voltage-applying unit. The hole-type electrodes are arranged at predetermined intervals in the direction of thickness. The voltage-applying unit applies a voltage to the hole-type electrodes. One of the electrodes is not adjacent to any other electrode and is used as an anode. The remaining electrodes are used as cathodes. A sensor-element array is provided on the detecting surface of the image sensor. The array comprises a plurality of sensor elements arranged in the form of a matrix. Each sensor element comprises an anode, a plurality of cathodes, and CdTe lying between the anode and the cathodes.

21 Claims, 10 Drawing Sheets

IMAGE SENSOR AND METHOD OF MANUFACTURING THE SAME

CROSS-REFERENCE TO RELATED APPLICATIONS

This is a Continuation Application of PCT Application No. PCT/JP02/11524, filed Nov. 5, 2002, which was not published under PCT Article 21(2) in English.

This application is based upon and claims the benefit of priority from the prior Japanese Patent Application No. 2001-339711, filed Nov. 5, 2001, the entire contents of which are incorporated herein by reference.

BACKGROUND OF THE INVENTION

1. Field of the Invention

The present invention relates to an image sensor for detecting rays and a method of manufacturing the same.

2. Description of the Related Art

Image sensors for detecting rays such as hard X rays or γ rays and generating image data are used in various fields of technology. The image sensor may detect a radiation field emanating from a celestial body, which can be analyzed to determine the physical conditions and spatial structure of the celestial body. The image sensor may apply X rays to a human subject or the like and detect the waves passed through it, from which a tomogram of the human subject or the like can be obtained. The image sensor is used in other fields. For example, it is employed in nuclear engineering (e.g., examination of glass-sealed radioactive waste and ray-monitoring), nondestructive inspection (e.g., inspection of semiconductor devices), and a resources survey (e.g., a survey of resources in the ground).

The image sensor hitherto used in these fields of art has, for example, the structure described below.

FIG. 1A shows a conventional image sensor 80 of a representative type. As shown in FIG. 1A, the image sensor 80 has a detecting element (Si element or Ge element) 81 and an amplifier IC 84. The detecting element 81 detects the incident rays and generates electric signals from the rays. The amplifier IC 84 lies in the same plane as the detecting element 81. It amplifies the electric signal the element 81 has generated. Bonding wires 83 connect the output wires of the detecting element 81 to the amplifier IC 84 by bonding wires 83.

FIG. 1B is a cross-sectional view, taken along line 1B—1B shown in FIG. 1A. As FIG. 1B shows, the detecting element 81 has a semiconductor (Si, Ge, CdTe, CdZnTe, or the like) layer 87 and electrodes 85 and 86. The electrodes 85 and 86 hold the layer 87 between them. A voltage is applied between the electrodes 85 and 86, thereby detecting rays of various energy bands, from the electrons and protons generated as rays are applied to the image sensor 80.

An image sensor that employs an Si element or a Ge element can detect only low-energy X rays of few keV to tens of keV. Its sensitivity is far from the value that is demanded in practice.

Even a high-sensitivity image sensor using CdTe or CdZnTe cannot efficiently collect electric charges for the following reason, so long as its structure remains conventional. The semiconductor layer may be made thick in order to promote the scattering of high-energy particles in the material. If the layer is thick, the distance between the electrodes will increase. This lowers the efficiency of collecting electric charges. Consequently, the sensitivity will decrease. To enhance the efficiency of collecting electric charges, the semiconductor layer may be made thin. In this case, the scattering of high-energy particles in the material will be suppressed. The sensitivity of the image sensor will inevitably decrease, though the charge-collecting efficiency increases.

The present invention has been made in consideration of the foregoing. An object of the invention is to provide an image sensor that can detect rays, even those of hard X-ray energy band, with high sensitivity, and to provide a method of manufacturing such an image sensor.

Another object of the present invention is to provide a hole-making technique in handling harmful substances, such as CdTe, which impose no adverse influence on human beings.

BRIEF SUMMARY OF THE INVENTION

According to a first aspect of the invention there is provided an image sensor that comprises a plate which is made of a semiconductor. A plurality of first hole-type electrodes are provided on the plate and arranged at predetermined intervals in a first direction and a second direction. A plurality of second hole-type electrodes are provided on the plate, arranged at predetermined intervals in the first direction and the second direction and located adjacent to the first electrodes. A voltage-applying unit applies a first voltage to the plurality of first hole-type electrodes and a second voltage to the plurality of second hole-type electrodes. A reading unit reads electric signals from a plurality of sensor elements, each comprising one first hole-type electrode, a plurality of second hole-type electrodes which are located adjacent to the first hole-type electrode, and the semiconductor provided between the first hole-type electrode and the second hole-type electrodes.

According to a second aspect of the invention there is provided an image sensor according to the first aspect in which the first and second hole-type electrodes are provided in a direction of thickness of the plate.

According to a third aspect of this invention there is provided an image sensor according to the first aspect in which each of the sensor elements has a first hole-type electrode and a plurality of second hole-type electrodes spaced apart equidistantly and arranged equidistantly from the first hole-type electrode.

According to a fourth aspect of the invention there is provided an image sensor according to the third aspect wherein each of the sensor elements has four second hole-type electrodes.

According to a fifth aspect of the present invention there is provided an image sensor according to the third aspect wherein each of the sensor elements has six second hole-type electrodes.

According to a sixth aspect of this invention there is provided an image sensor according to the third aspect wherein each of the sensor elements has eight second hole-type electrodes.

According to a seventh aspect of the invention there is provided an image sensor according to the first aspect. In this image sensor, the reading unit has an IC substrate supporting the plate and having a plurality of ICs for amplifying electric signals generated from the rays applied to any one of the plurality of sensor elements. The image sensor further comprises a connecting layer provided between the plate and the IC substrate and electrically connecting the first hole-type electrodes or second hole-type electrodes of each sensor element to electrodes of one IC.

According to an eighth aspect of the invention there is provided an image sensor according to the seventh aspect wherein the connecting layer has a plurality of stud bumps provided on the electrodes of each of the ICs and a plurality of thin layers provided on tips of each of the stud bumps and electrically connected to the first electrodes or second electrodes of each of the sensor elements.

According to a ninth aspect of this invention there is provided an image sensor according to the eighth aspect wherein the connecting layer has an insulating layer that embeds each of the stud bumps and each of the thin layers.

According to a tenth aspect of the present invention there is provided an image sensor according to the eighth aspect wherein each of the stud bumps is made of gold, and each of the thin layers is made of indium.

According to an eleventh aspect of the invention there is provided an image sensor according to the seventh aspect wherein the connecting layer has a plurality of multi-stacked stud bumps provided on the electrodes of each of the ICs, each multi-stacked stud bump comprising at least two stud bumps laid one upon the other, and a plurality of thin layers provided on tips of each of the stud bumps and electrically connected to the first electrodes or second electrodes of each of the sensor elements.

According to a twelfth aspect of this invention there is provided an image sensor according to the eleventh aspect wherein the connecting layer has an insulating layer that embeds each of the stud bumps and each of the thin layers.

According to a thirteenth aspect of this invention there is provided an image sensor according to the eleventh aspect wherein each of the stud bumps is made of gold, and each of the thin layers is made of indium.

According to a fourteenth aspect of the invention there is provided an image sensor according to the first aspect wherein the semiconductor is a compound semiconductor selected from the group consisting of CdTe, CdZnTe and other compound semiconductors.

According to a fifteenth aspect of the invention there is provided a method of manufacturing an image sensor. The method comprises holding a semiconductor plate between an upper layer and a lower layer; immersing the semiconductor plate, upper layer and lower layer in water and making a plurality of holes in the semiconductor plate, upper layer and lower layer, at predetermined intervals with a drill having a prescribed size; removing the upper layer and lower layer from the semiconductor plate; forming a plurality of hole-type electrodes by filling the holes with metal; and forming electric wires to apply a voltage between any hole-type electrode that is not adjacent to other hole-type electrodes and is used as an anode, and some hole-type electrodes that are adjacent to the anode and are used as cathodes.

According to a sixteenth aspect of the invention there is provided a method of manufacturing an image sensor according to the fifteenth aspect. In the process of forming the electric wires, a stud bump is formed on each of electrode pads of a prescribed number of IC chips provided on a first substrate. A second substrate is plated with indium. The indium is transferred from the second substrate to the tip of each stud bump, thereby forming a plurality of thin layers. The thin layers are connected to the hole-type electrodes, thereby Flip-mounting a sensor-element array on each of the ICs. The array consists of sensor elements arranged in the form of a matrix, each sensor element comprising an anode, a plurality of cathodes and a semiconductor lying between the anode and the cathodes. Insulating resin is applied into a gap between the first substrate and the sensor-element array and cured.

According to a seventeenth aspect of this invention there is provided an image sensor apparatus that comprises a plurality of image sensors and an output unit. Each of the image sensors comprises a plate made of semiconductor. A plurality of first hole-type electrodes are provided on the plate and arranged at predetermined intervals in a first direction and a second direction. A plurality of second hole-type electrodes are provided on the plate and arranged adjacent to the first hole-type electrodes at predetermined intervals in the first direction and second direction. A voltage-applying unit applies a first voltage to the first hole-type electrodes and a second voltage to the second hole-type electrodes. A reading unit reads an electric signal from a plurality of sensor elements, each comprising one first hole-type electrode, some second hole-type electrodes adjacent to the first hole-type electrode and the semiconductor lying between the one first hole-type electrode and the some second hole-type electrodes. The output unit outputs the electric signals read by the reading units independently of one another.

According to an eighteenth aspect of the invention there is provided an image sensor apparatus according to the seventeenth aspect. In this image sensor apparatus, each of the reading units has an IC substrate supporting the plate and having a plurality of ICs for amplifying electric signals generated from the rays applied to any one of the plurality of sensor elements. The apparatus comprises a connecting layer provided between the plate and the IC substrate and electrically connecting the first hole-type electrodes or second hole-type electrodes of each sensor element to electrodes of one IC.

According to a nineteenth aspect of the invention there is provided an image sensor apparatus according to the eighteenth aspect wherein the connecting layer has an insulating layer that embeds each of the stud bumps and each of the thin layers.

According to a twentieth aspect of the present invention there is provided an image sensor apparatus according to the seventeenth aspect wherein the first and second hole-type electrodes are arranged in a direction of thickness of the plate.

DETAILED DESCRIPTION OF THE INVENTION

Figure 1A:
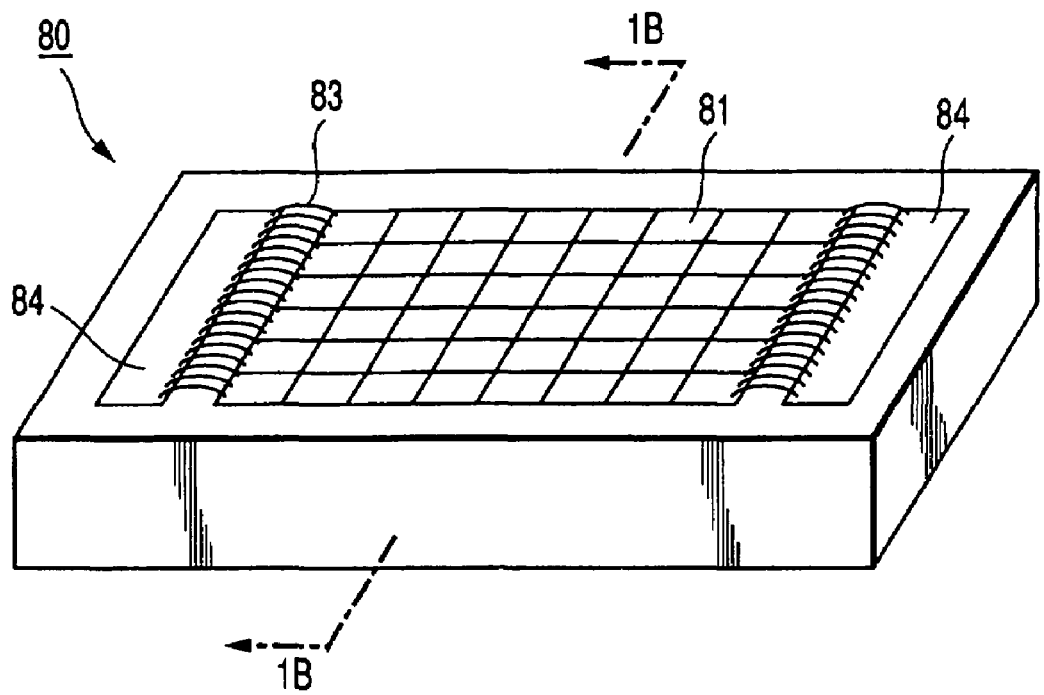
FIG. 1A and FIG. 1B are diagrams explaining a conventional image sensor.

The first and second embodiments of the present invention will be described with reference to the accompanying drawings. In the following description, any two components almost identical in function and structure are designated by the same reference numeral, and they will both be described only if necessary.

First Embodiment

Figure 6:
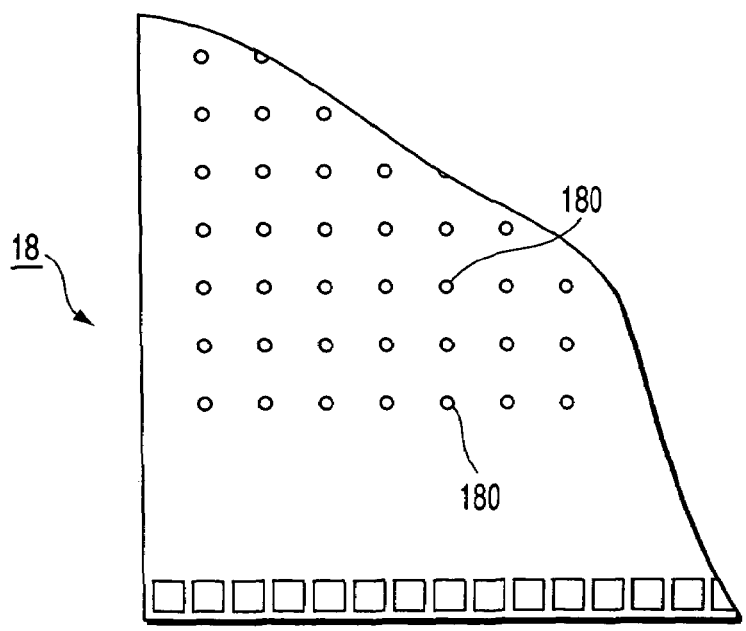
FIG. 6 is a magnified view of a part encircled in FIG. 5.
Figure 7:
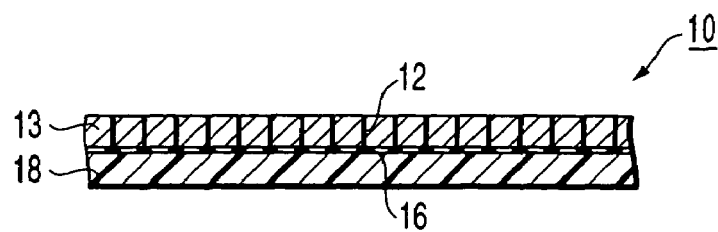
FIG. 7 is a cross-sectional view of the image sensor 10, taken along line 7—7 shown in FIG. 2A.
Figure 8:
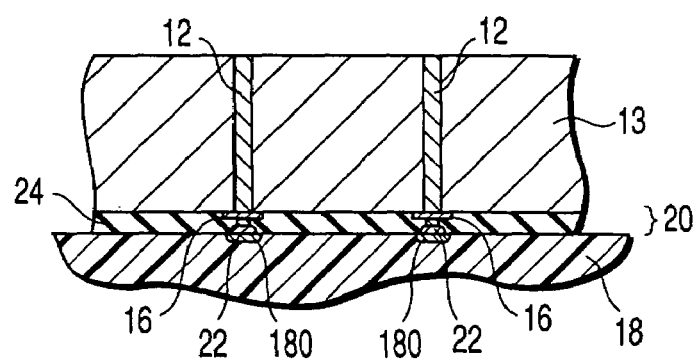
FIG. 8 is a magnified view of a junction between a CdTe plate 13 and the wiring layer 19, both shown in the cross-sectional view of FIG. 7.
Figure 9:
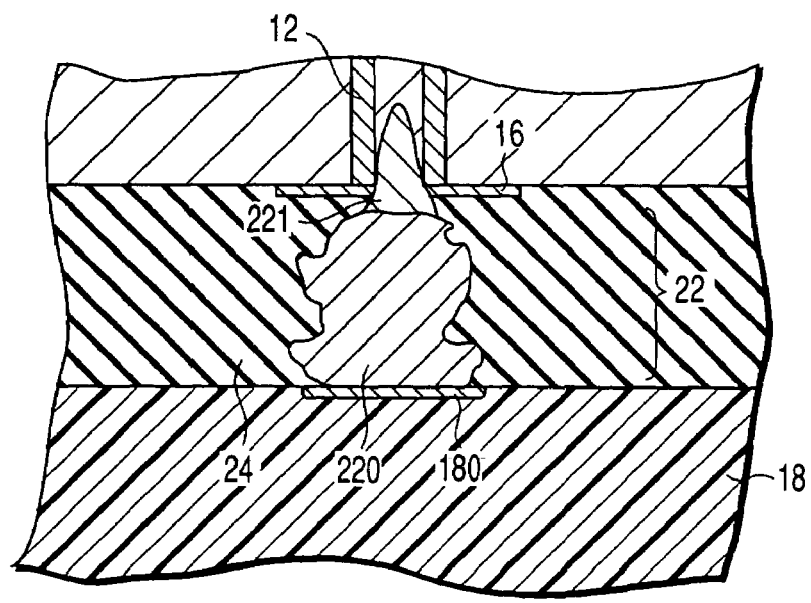
FIG. 9 is a magnified view of a stud-bump connecting portions of a connecting layer 20 has.

The image sensor according to this embodiment comprises a semiconductor plate 13 (see FIG. 2A to FIG. 4), an IC substrate 18 (see FIG. 5 and FIG. 6), and a connecting layer 20 (see FIG. 7 to FIG. 9). The semiconductor plate 13 is made of semiconductor such as CdTe (cadmium telluride), CdZnTe (zinc-cadmium telluride) or the like and has a prescribed thickness. First electrodes 12 of a hole-type are arranged on one surface of the semiconductor plate 13 at a predetermined pitch, the surface functioning as a detecting surface. The IC substrate 18 has ICs mounted on it. The ICs are designed to amplify the signals detected at the detecting surface. The connecting layer 20 connects the IC substrate 18 and the CdTe plate 13. For simplicity, the semiconductor plate 13 will be described hereinafter as one made of CdTe. Nonetheless, the image sensor 10 can be of the same structure if the plate 13 is made of another semiconductor such as CdZnTe.

Figure 2A:
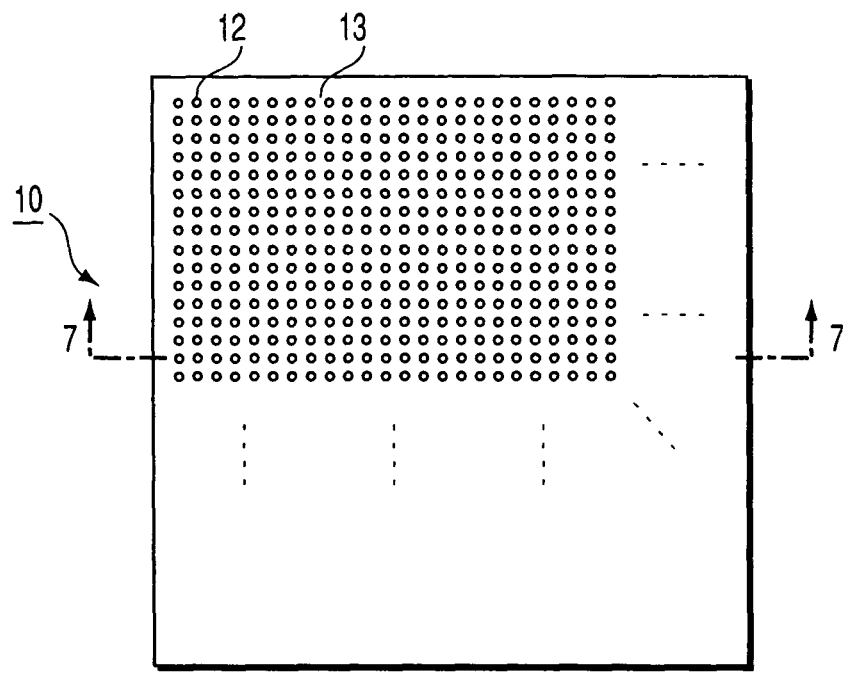
FIG. 2A is a top view of an image sensor 10 according to a first embodiment, showing a detecting surface of the image sensor 10.

FIG. 2A is a top view of the image sensor 10, showing the detecting surface of the sensor 10. The semiconductor plate 13 made of CdTe provides the detecting surface of the image sensor 10. CdTe is a compound semiconductor consisting of Cd (cadmium) and Te (tellurium). Its energy gap is about 1.47 eV at room temperature.

The first electrodes 12 of the hole-type are formed as follows. First, a plurality of holes are made in the CdTe plate 13 at the predetermined pitch (e.g., 50 microns), by using a drill having a diameter of about 100 to 200 microns. Then, the holes thus made are filled with Pt, Hg, Au, InTe, Al or the like, by means of metallization. Second electrodes 16 (pads) are provided, each at one end of one first electrode 12, for achieving electrical connection between the first electrode 12 and wire-leading means, which will be described later.

CdTe and CdZnTe are generally brittle and harmful to humans. In view of this, the holes are made by a special method that will be described later.

The first electrodes 12 are divided into two groups, namely anodes and cathodes. One anode, cathodes and a part of the CdTe plate 13 (or CdZnTe plate) constitute a sensor element.

Figure 2B:
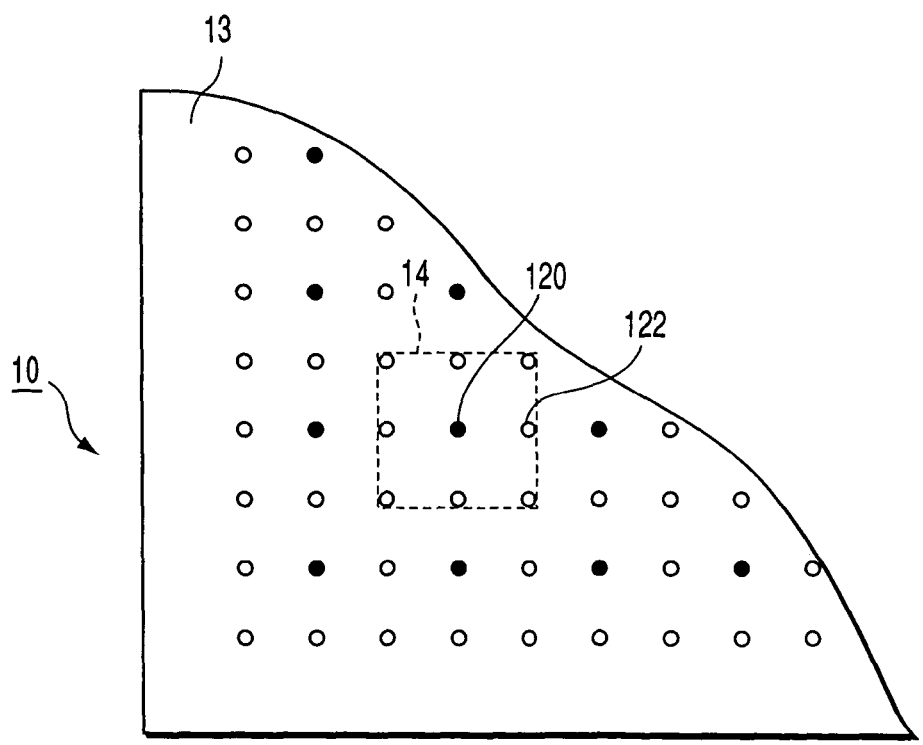
FIG. 2B is a magnified top view, showing a part of the detecting surface of the image sensor 10.

FIG. 2B is a magnified top view, showing a part of the detecting surface of the image sensor 10. In FIG. 2B, the black dots represent some first electrodes 12 that are used as anodes, and the white dots indicate the other first electrodes 12 that are used as cathodes. The first electrodes 12 are distributed such that every first electrode 12 adjacent to any anode used as an anode function as cathodes. In the image sensor 10 of FIG. 2B, sensor elements 14 are arranged, forming a matrix, and each sensor element 14 comprise one anode 120, eight cathodes and a part of the CdTe plate.

In FIG. 2B, the broken lines 14 indicate a sensor element 14 that comprises an anode, cathodes and a part of the CdTe (or CdZnTe) plate. In each sensor element 14, a voltage is applied between the anode 120 and the cathodes 122, developing a depletion layer. When rays are applied to the depletion layer, many electrons and holes are generated along the tracks of rays. Each sensor element 14 extracts both the positive charge and the negative charge in the form of an electric signal. That is, the element 14 generates image data from the rays applied to it.

The sensor element 14 is not limited to the type illustrated in FIGS. 2A and 2B, so long as it comprises one first electrode assigned as an anode and some other first electrodes assigned as cathodes. The element 14 may have any one of the following modifications.

Figure 3:
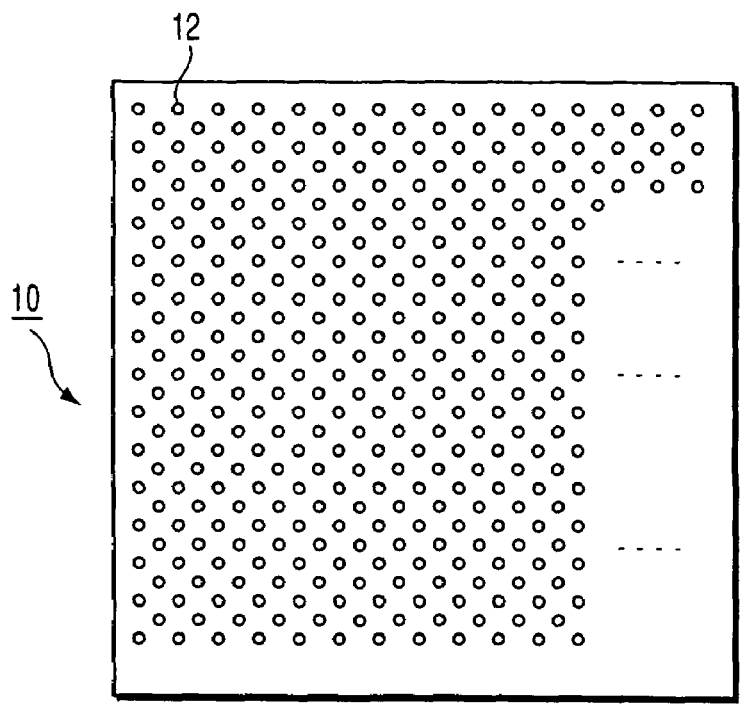
FIG. 3 is a top view, illustrating the detecting surface of a modification of the image sensor 10 according to the first embodiment.
Figure 4:
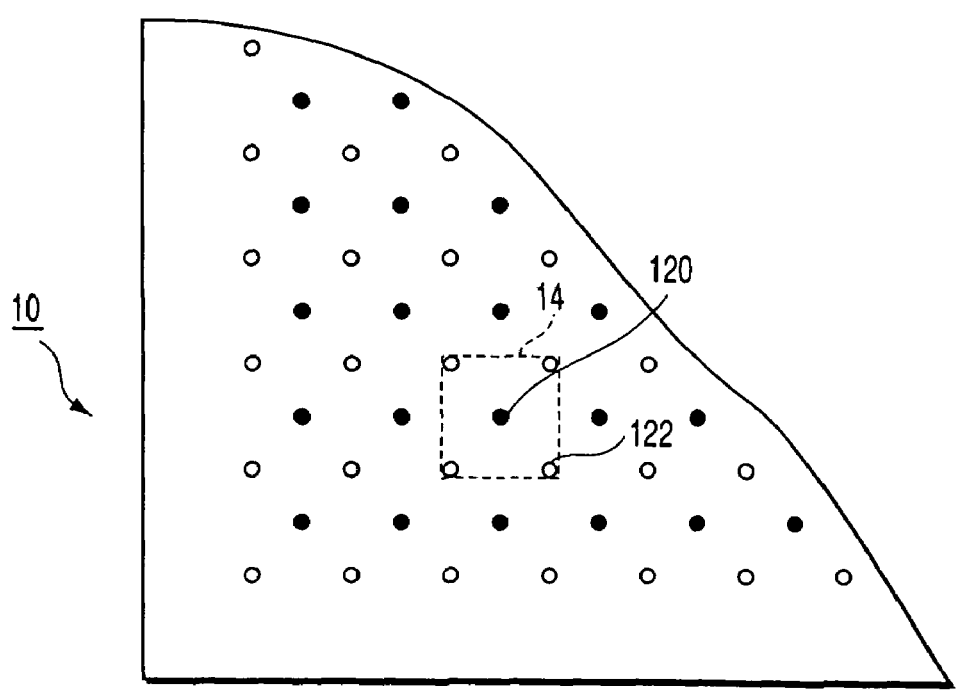
FIG. 4 is a magnified top view, depicting a part of the detecting surface of the image sensor 10 shown in FIG. 3.

FIG. 3 is a top view, showing the detecting surface of a modification of the image sensor 10. FIG. 4 is a magnified top view, depicting a part of the detecting surface of the image sensor 10 shown in FIG. 3. As FIG. 3 shows, the sensor element 14 may comprise one anode 120 and four adjacent cathodes allocated to the anode 120.

Figure 5:
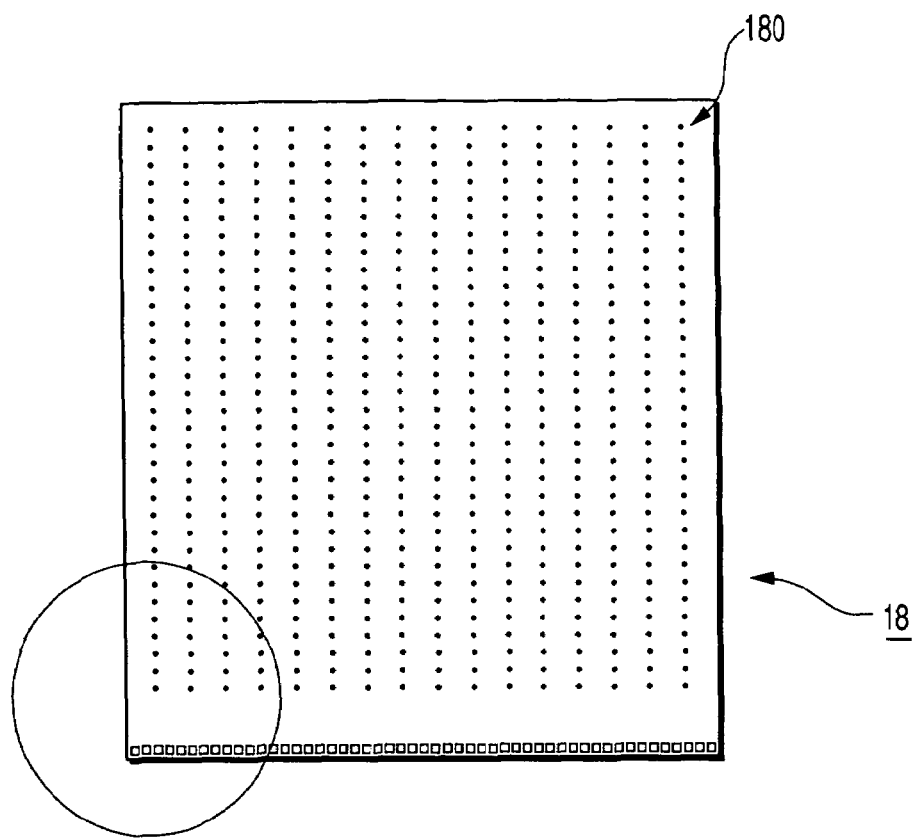
FIG. 5 is a top view, schematically showing a wiring layer 19.

The IC substrate 18 that the image sensor 10 has will be described. FIG. 5 is a top view, schematically showing the IC substrate 18. FIG. 6 is a magnified view of that part encircled in FIG. 5.

All anodes 120 are independently connected and all cathodes 122 are connected by the wiring layer 19 to electrodes from which signals are extracted to an external apparatus.

The IC substrate 18 is a substrate on which a plurality of ICs are mounted to amplify the signals the sensor elements 14 have detected. On the IC substrate 18, Flip-chip pads 180 (hereinafter referred to as "FC pads") of the ICs, each having an anti-radiation property, are arranged, forming a two-dimensional matrix. The FC pads are aligned with the anodes and cathodes, which are first electrodes 12 as mentioned above. Flip-chip mounting (hereinafter referred to as "FC mounting") is accomplished using the positions of the anodes and cathodes as reference positions. The stud-bump connecting portions, which will be described later, are provided on the FC pads 180.

The FC pads 180 mounted on the IC substrate 18 allocate the anodes and cathodes, i.e., the first electrodes 12.

The connecting layer 20 that exists between the CdTe plate 13 and the IC substrate 18 will be described, with reference to FIG. 7 to FIG. 9.

FIG. 7 is a cross-sectional view of the image sensor 10, taken along line 7—7 shown in FIG. 2A. FIG. 8 is a magnified view showing the first electrodes 12 and some other components adjacent to them, which are shown in FIG. 7. FIG. 9 is a magnified view explaining the stud-bump connecting portions 22 that draws wires from the first electrodes 12. As can be seen from these figures, the connecting layer 20 has stud-bump connecting portions 22 and an insulating layer 24. The stud-bump connection portions 22 secure the CdTe plate 13 to the IC substrate 18.

Each stud-bump connecting portion 22 is formed on one FC pad 180 provided on the IC substrate 18. It has an Au stud bump 220 and an indium layer 221 (see FIG. 9). The bump 220 is made of gold or the like. The indium layer 221 is formed on the tip of the Au stud bump 220. The Au stud bump 220 comprises one projecting bump or two or more projecting bumps laid one on another. The Au stud bump 220 serves to make a current flow between the sensor element and the IC, to reduce the leakage current flowing between the sensor elements (particularly, if it comprises two, three or more bumps), and to compensate for the connection error made during the FC mounting. Hence, its material is preferably a relatively soft metal that exhibits good conductivity. This is why each stud bumps 220 is made of gold in the present embodiment. Nevertheless, it may be made of any other material that has the same function.

The indium layer 221 is composed of a thin layer that lies on the tip of the Au stud bump 220, and a portion that protrudes into the electrode 12. The indium layer 221 gradually becomes thinner toward the tip while being formed and has a particular height. During the FC mounting, the indium layer 221 is pushed onto the second electrode 16. (As it is so pushed, its part is inserted into the hole defined by the electrode 12 provided on the CdTe plate 13.) The indium layer 221 ensures a current supply between the sensor element 14 and the IC. It has a prescribed height that is required in the FC mounting, as will be described later. Its material is preferably solder having a melting point of 100° C. or less, because CdTe elements are used in the present embodiment. Bismuth, for example, may be used in place of indium.

Figure 10:
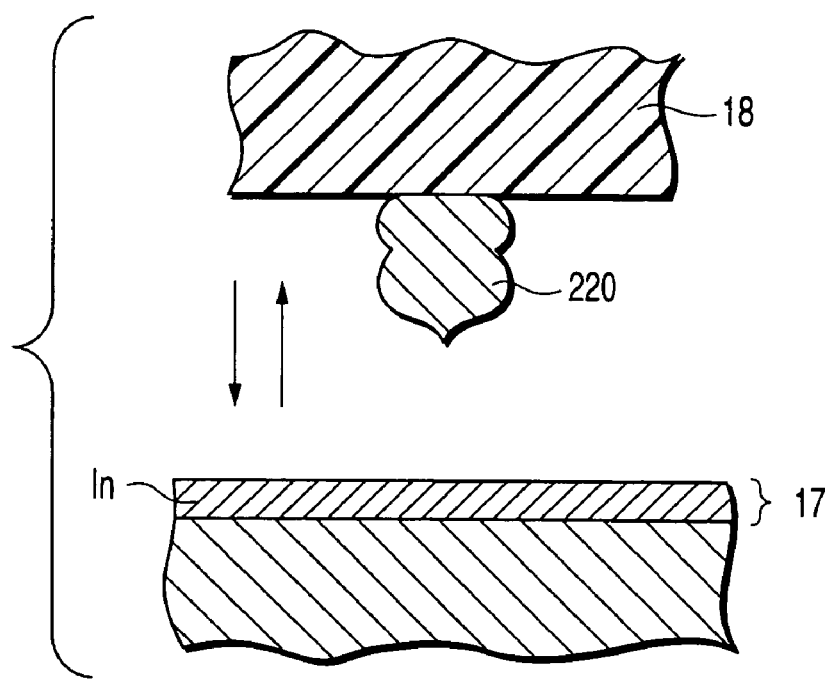
FIG. 10 is a diagram explaining a method of forming an indium layer.
Figure 11:
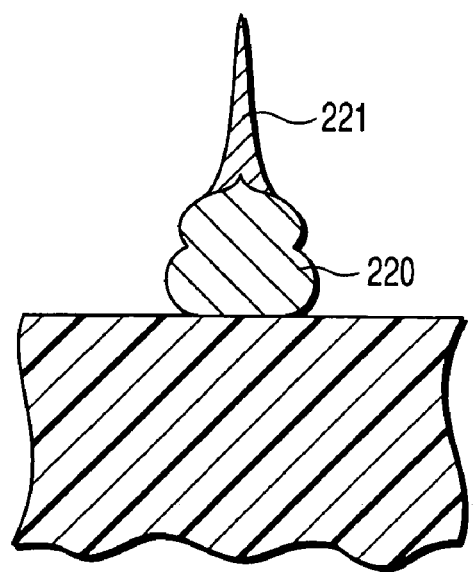
FIG. 11 is a diagram illustrating the method of forming an indium layer.

FIG. 10 and FIG. 11 are diagrams explaining a method of forming the indium layer 221. As FIG. 10 shows, the IC substrate 18 having an Au stud bump 220 on the surface opposing an FC bonding machine (not shown) is pressed onto an In-plated stainless steel substrate 17. The substrate 18 is so pressed at a head temperature, a head speed and with a force, all controlled and adjusted to prescribed values. The substrate 18 may be pressed repeatedly, a number of times, in some case. After being pressed for a predetermined time, the head is pulled up at a prescribed head temperature and head speed and with a prescribed force, all controlled. Indium (In) is thereby transferred to the tip of the Au stud bump 220.

FIG. 11 schematically depicts the In layer 221 formed on the tip of the Au stud bump 220. As FIG. 11 shows, the In layer 221 is gradually thinner toward its tip and has a predetermined height. The Au stud bump 220 is not collapsed yet as illustrated in FIG. 9. The stud-bump connecting portion 22 assumes the shape shown in FIG. 9 when the stud bump portion 20 shown in FIG. 11 is pressed onto the second electrode 16 in the course of the FC mounting.

The insulating layer 24 is a resin layer formed in the manner of under-filling. It is made of, for example, epoxy resin. The insulating layer 24 embeds the stud-bump connecting portion 22 and the indium layer, electrically insulating them and reinforcing them. The insulating layer 24 prevents the thermal stress generated due to the difference in thermal expansion coefficient between each sensor element 14 and the IC substrate 18 from concentrating in the stud-bump connecting portion 22 and indium layer.

The image sensor 10 has a sensor-element array comprising sensor elements 14 that are independent pixels and are arranged constituting a matrix. Each sensor element 14 of the image sensor 10 generates a signal, independently of any other sensor element. Thus, the sensor-element array can process signals, each for one sensor element 14.

The image sensor 10 may have additional sensor elements in the sensor-element array. In this case, the plate 13 is made larger and more first electrodes 12 are mounted on the plate 13. Alternatively, more first electrodes 12, each having a smaller diameter, are arranged on the plate 13 at a shorter pitch. In either way, the image sensor 10 can easily have many pixels. Further, the image sensor 10 may be made thicker. If this is the case, the electric charge can be collected with high efficiency without changing the voltage that is applied to collect the electric charge. If the elements 14 increase in number and the sensor 10 increases in thickness, the sensor 10 will be a highefficiency gamma-ray detector.

When a voltage is applied to each sensor element 14 of the image sensor 10, the electric field applied between the anode and the cathodes becomes logarithmic. This means that the sensor element 14 has a structure that can collect electrons both efficiently and reliably. As a result, the resolving power can be enhanced.

In the image sensor 10, the connecting layer 20 (particularly, the stud-bump connecting portion 22 and the In layer 221) serves to mount the sensor-element array on the IC substrate 18. A three-dimensional mounting is thereby attained. This can be said to be one characterizing feature. In the image sensor obtained by the three-dimensional mounting, each sensor element is connected at its lower end to an IC. Thus, the image sensor can easily extract signals even if it has more sensor elements. It can therefore serve to form an image that consists of more pixels than images hitherto formed. In addition, the three-dimensional mounting can realize a small image sensor.

The electric wires can be drawn from the first electrodes 12 by using a wiring board or by performing direct drawing that uses cables, not by using the above-mentioned bumps. If the direct drawing achieved by using cables is employed, the second electrodes 16 may not be used. If a wiring board is used, it may serve to assign some of the first electrodes 12 as anodes, and the other first electrodes 12 as cathodes.

(Method of Manufacturing the Image Sensor)

A method of manufacturing the image sensor 10 will be outlined below. CdTe and CdZnTe are semiconductor materials that are generally brittle. Hence, when holes aligned with the first electrodes 12 are made in the semiconductor plate 13 with a drill or the like, chipping, cracking or the like may occur. Chipping or cracking may lower the detecting ability of the sensor elements 14 or may ultimately the performance of the image sensor.

CdTe and CdZnTe and other compound semiconductors are substances harmful to humans. When holes aligned with the first electrodes 12 are made in the semiconductor plate 13 with a drill or the like, CdTe particles float in the air, and the persons engaged in the manufacture of the image sensor may take in the particles as they breathe. This risk is a great obstacle to the manufacture of the image sensor 10 and is detrimental to the mass production of the image sensor 10.

This method solves these problems. It prevents chipping and cracking. It is safe and helps to achieve mass production.

Figure 12:
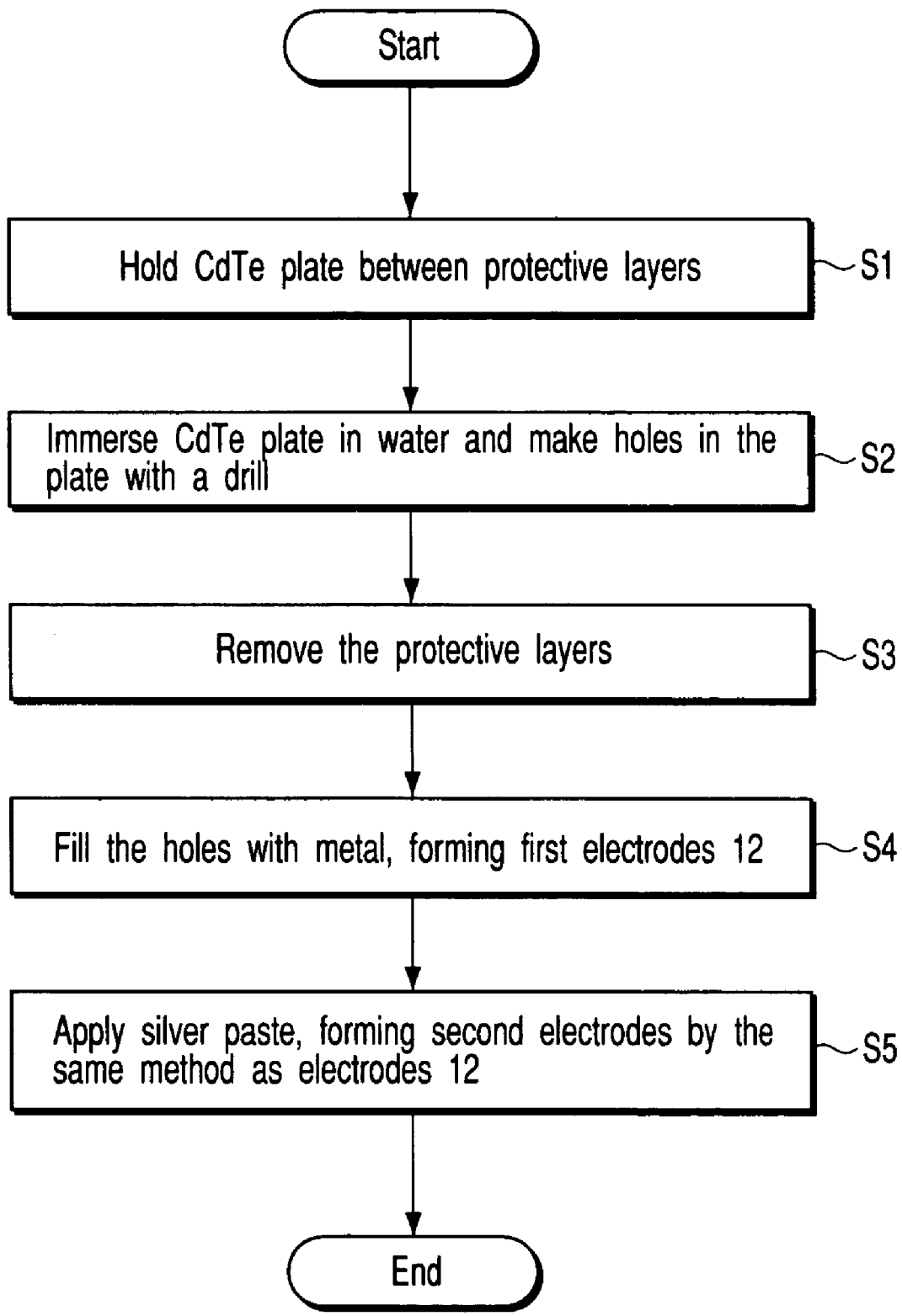
FIG. 12 is a flowchart outlining a method of the image sensor 10.

FIG. 12 is a flowchart that outlines the method of the image sensor 10. As shown in FIG. 12, a CdTe plate of a prescribed size is held between protective layers (Step S1).

The protective layers are two layers having a predetermined thickness. One is laid on the upper side of the CdTe plate, and the other on the lower side of the CdTe plate. The protective layers have the function of preventing chipping and cracking from developing in the CdTe plate when a plurality of holes are made in the plate, in alignment with the first electrodes 12. Preferably, they are made of a material almost as hard as CdTe (e.g., one having hardness of x±0.3×, where x is the hardness of CdTe). Alternatively, they may be made of CdTe. The CdTe plate is, for example, clamped between, or adhered to, the protective layers made of such a material.

Next, the CdTe plate thus protected by the protective layers is immersed into water, and holes of a prescribed size are made in the plate with a drive having a prescribed size in alignment with the first electrodes 12 (Step S2). The CdTe plate is immersed into water in order to prevent powder of CdTe or the like, which is a harmful substance, from floating in the air. The liquid used to prevent powdered CdTe or the like from floating is not limited to water. Any liquid that would not undergo chemical reaction with CdTe or the like can be used. Alcohol, for example, can be used to attain the same objective. Water is used in the present embodiment in view of possible cost reduction.

The protective layers are then removed from the CdTe plate (Step S3).

Thereafter, metallization is carried out in the holes, forming first electrodes 12 of a hole-type (Step S4). The metallization employed may be plating, sputtering, vapor deposition, or the like.

Finally, second electrodes 16 are formed, each on one end of one first electrode 12, by applying silver paste or by performing the same method as in the step of forming the electrodes 12 (i.e., plating, sputtering, vapor deposition, or the like) (Step S5). The CdTe plate 13 can be obtained.

The inventors of this invention have conducted experiments. Good results were obtained in Step S1, particularly when the protective layers laid on the upper and lower sides of the CdTe plate, respectively, had a thickness equal to or greater than half the thickness of the CdTe plate. Further, neither chipping nor cracking occurred even when holes were made at the pitch of 100 microns with a drill having a diameter of 50 microns. Thus, a good image sensor 10 could be manufactured.

The manufacturing method described above can prevent chipping and cracking when the plate is made of CdTe, CdZnTe, GaAs, HgIn, HgIz or any other compound semiconductor, which is brittle and harmful to humans. Therefore, the method can manufacture the image sensor both safely and easily.

Second Embodiment

The second embodiment will be described. The second embodiment is an image sensor unit (i.e., three-dimensional image sensor) 30 that comprises a plurality of image sensors 10 according to the first embodiment. The image sensor unit 30 can detect the incidence angle of rays to be detected. If incident γ rays have a large amount of energy, additional sensors may be used (thus forming a multi-layer or multi-stage structure). This brings forth a practical advantage, particularly in space physics and the like, where it is important to know the incident angle of X rays or the like radiated from celestial bodies. In medicine and engineering, too, this can makes it possible to detect a position in space, as an image, from which rays have been emitted.

Figure 13:
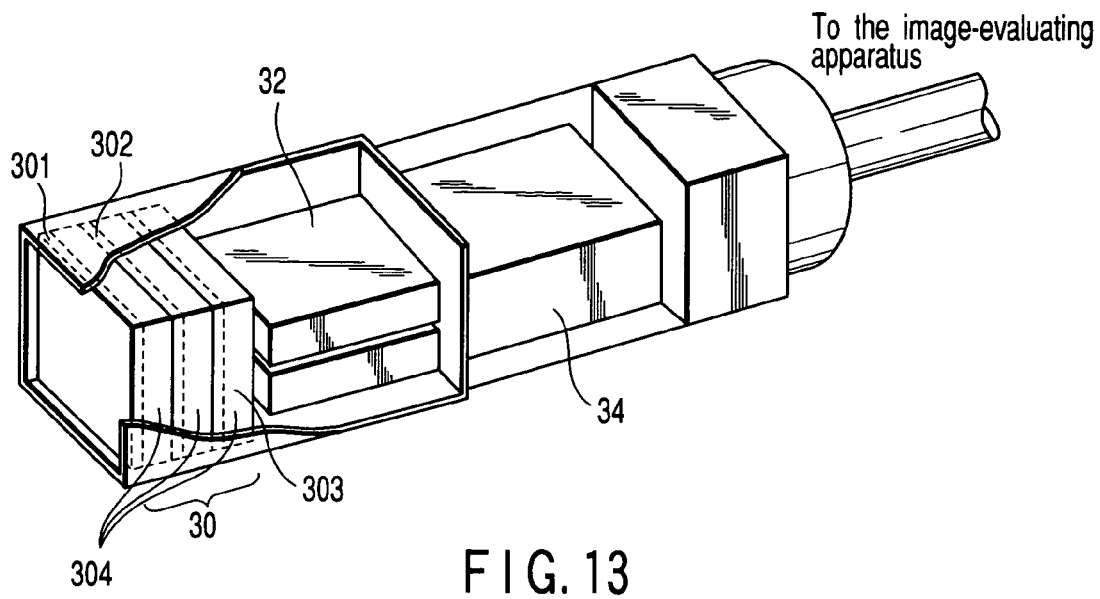
FIG. 13 shows an outer appearance of a radiation camera module that comprises an image sensor unit 30.
Figure 14:
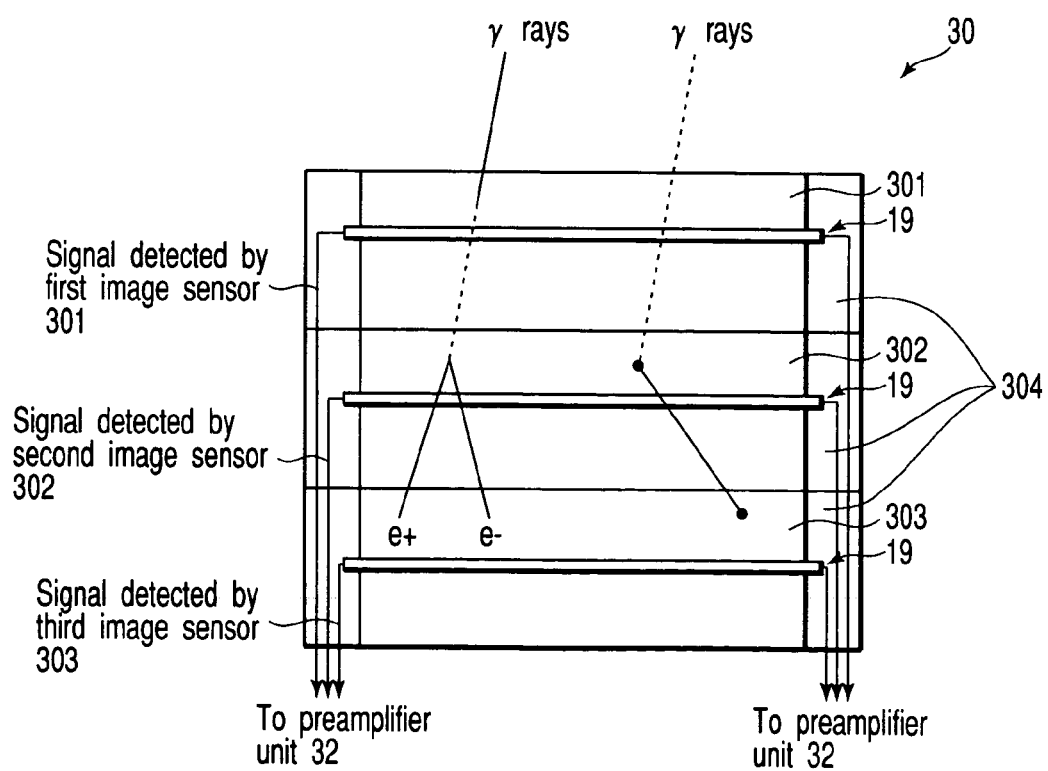
FIG. 14 is a schematic diagram showing the structure and function of the image sensor unit 30.

FIG. 13 shows an outer appearance of a radiation camera module that comprises the image sensor unit 30. FIG. 14 is a schematic diagram depicting the structure and function of the image sensor unit 30.

As FIG. 13 shows, the radiation camera module comprises an image sensor unit 30, a preamplifier unit 32, and a sampling amplifier unit 34.

Figure 15:
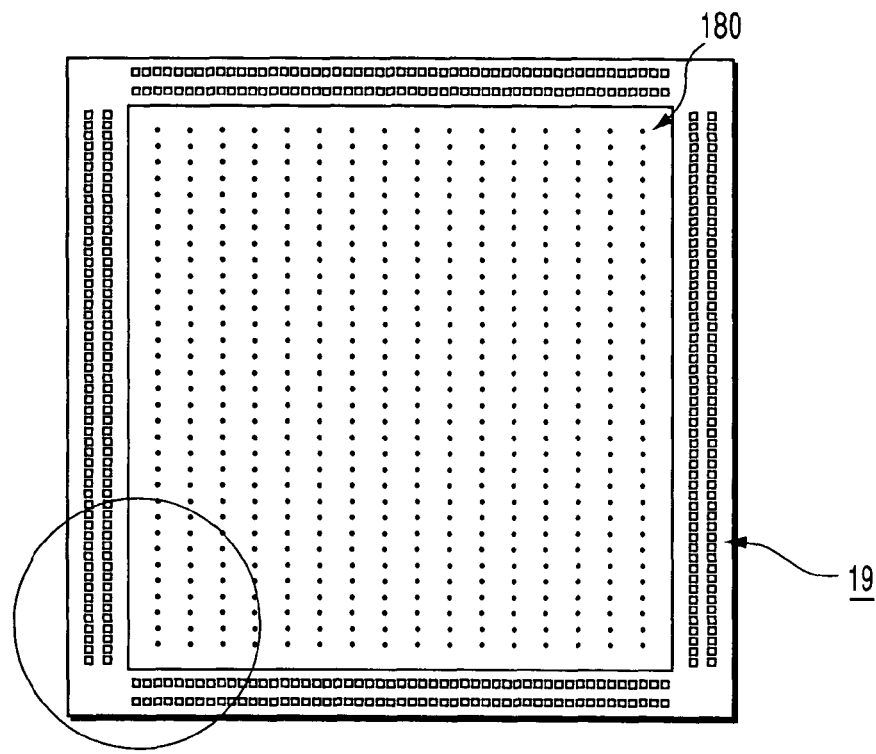
FIG. 15 is a top view depicting the detecting surface of an image sensor 10 according to a second embodiment.
Figure 16:
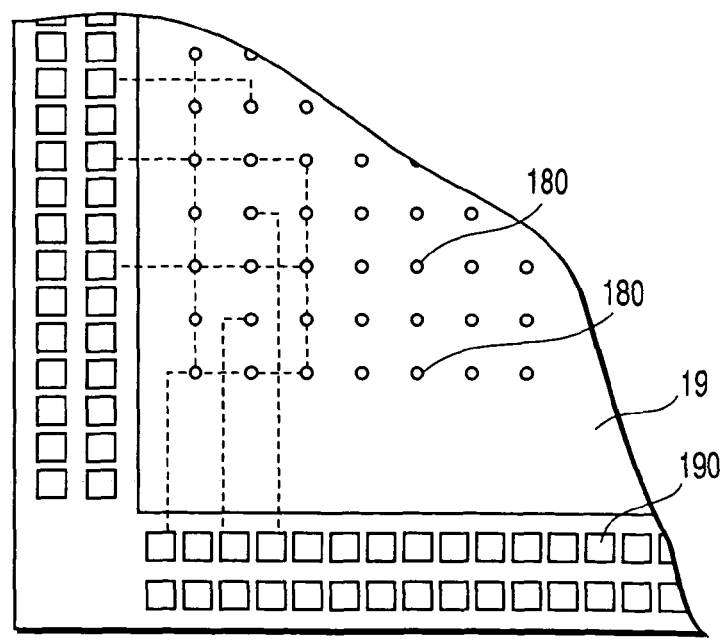
FIG. 16 is a magnified view showing a part of the detecting surface of the image sensor 10 according to the second embodiment.
Figure 17:
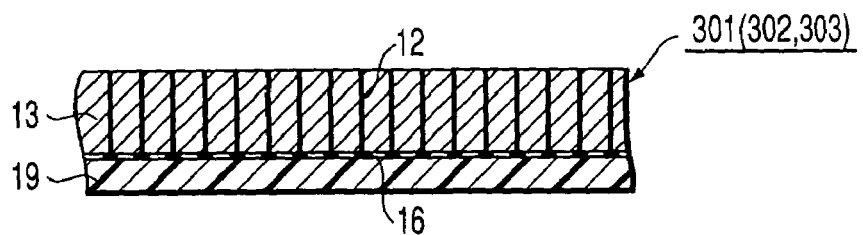
FIG. 17 is a cross-sectional view of the image sensor 10 according to the second embodiment.
Figure 18:
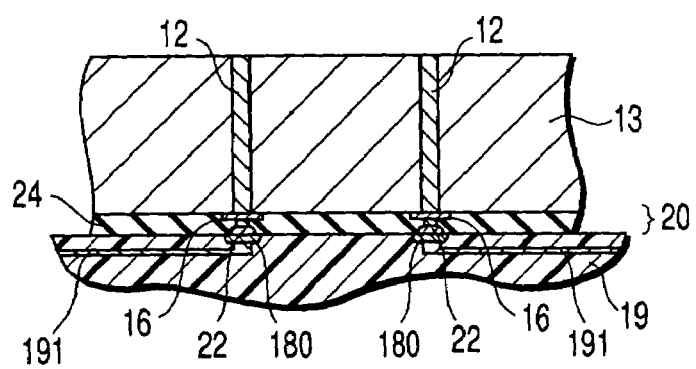
FIG. 18 is a magnified view showing the junction between the CdTe plate 13 and the wiring layer 19, both incorporated in the image sensor 10 according to the second embodiment.
Figure 19:
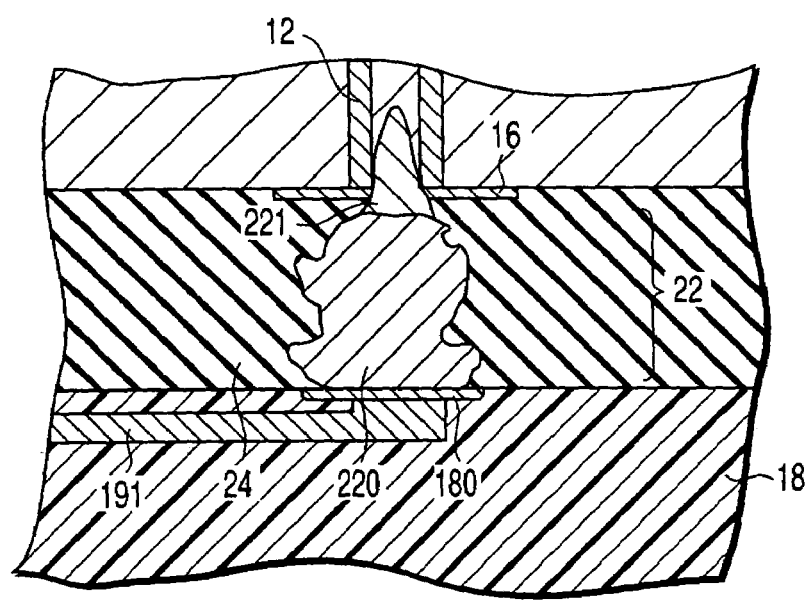
FIG. 19 is a magnified view showing a stud-bump connecting portion 22 provided in the image sensor 10 according to the second embodiment.

As illustrated in FIG. 14, the image sensor unit 30 comprises a plurality of image sensors 10 according to the first embodiment. It is configured to read signals, each detected by one image sensor 10. As seen from FIG. 15 and FIG. 16, each image sensor 10 of the image sensor unit 30 has a thin wiring layer 19 made of polyimide, epoxy or the like. The layer 19 is interposed between one image sensor 10 and another image sensor 10 in order to supply the signals detected by all sensor elements 14 to signal-extracting electrodes 190. The signals are supplied from the electrodes 190 to an external apparatus. FIG. 17 is a cross-sectional view of the image sensor 10. FIG. 18 is a magnified view showing the junction between the CdTe plate 13 and the wiring layer 19. FIG. 19 is a magnified view showing the stud-bump connecting portion 22. As FIG. 18, FIG. 19 and FIG. 16 (broken lines) show, the signal each detecting element 180 has detected is extracted to the signal-extracting element 190 through a signal-extracting wire 191. The signal is then sent to the preamplifier unit 32.

The preamplifier unit 32 is an amplifier connected to the input of the sampling amplifier unit 34. It amplifies the signal detected by the image sensor unit 30 and prevents noise from mixing into the signal and the S/N ratio of the signal from decreasing.

The sampling amplifier unit 34 is the main amplifier. It samples and amplifies the signal output from the preamplifier unit 32, generates a trigger signal, and performs a sample-and-hold process or the like.

The three-dimensional image sensor unit 30 detects, for example, γ rays of 1022 keV or more in the form of electron-hole pairs due to Compton scattering. Assume that cosmic rays (γ rays) reach the image sensor unit 30 in the direction shown in FIG. 14 and are converted to electron-hole pairs in the image sensor unit 30. The image sensors 301, 302 and 303 detect signals as electrons and protons pass through them. More precisely, the sensor elements 14 of each image sensor detect signals. The direction in which the cosmic rays are coming can therefore be determined with high precision by tracing the positions where the signals are detected in the image sensors 301, 302 and 303. The image sensor unit 30 can detect rays coming from any direction, because it does not need to have a collimator to limit the direction of incidence.

Figure 1B:
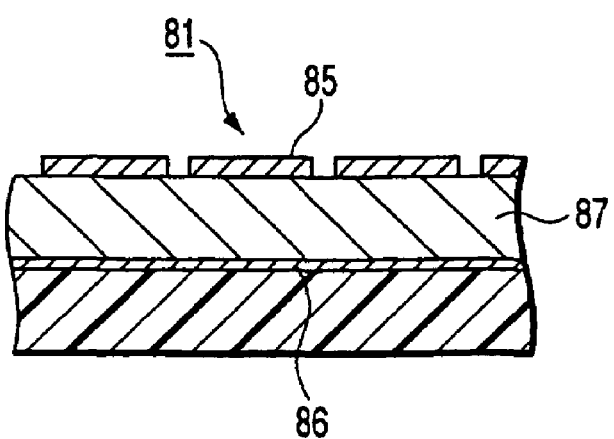

The present invention has been described, with reference to embodiments. Any person skilled in the art may make various changes and modifications within the scope of the invention. It should be understood that such changes and modifications fall within the scope of the present invention. The invention is not limited to, for example, the configuration illustrated in FIG. 1 and FIG. 3. The sensor elements 14, for example, may be hexagonal. In this case, each sensor element 14 comprises one anode located at the intersection of the diagonals and six cathodes located at the six vertexes.

The embodiments described above include various phases of the invention. The components disclosed herein may be combined in various ways to make various inventions. Even if some of the components of any embodiment described above are not used, it is possible to solve the problems specified in the "Problems to Be Solved by the Invention." Any configuration not using some of the components can be considered as the invention so long as it achieves at least one of the advantages stated in the "Advantages of the Invention."

The present invention can provide an image sensor that can detect rays, even those of hard X-ray energy band, with high sensitivity and high resolution, and can provide a method of manufacturing such an image sensor.

What is claimed is:

1. An image sensor comprising:
   a plate which is made of semiconductor;
   first hole-type electrodes, provided on the plate and arranged at predetermined intervals in a first direction and a second direction;
   second hole-type electrodes, provided on the plate; and arranged at predetermined intervals in the first direction and the second direction and located adjacent to the first electrodes;
   a voltage-applying unit which applies a first voltage to said first hole-type electrodes and a second voltage to said second hole-type electrodes; and
   a reading unit for reading electric signals from a plurality of sensor elements, each comprising one of said first hole-type electrodes, a plurality of said second hole-type electrodes located adjacent to the one of said first hole-type electrodes, and the semiconductor provided between the one of said first hole-type electrodes and the plurality of said second hole-type electrodes.

2. An image sensor according to claim 1, wherein the first and second hole-type electrodes extend in a direction of thickness of the plate.

3. An image sensor according to claim 1, wherein each of the sensor elements has the plurality of said second hole-type electrodes spaced apart equidistantly and arranged equidistantly from the one of said first hole-type electrodes.

4. An image sensor according to claim 3, wherein each of the sensor elements has four second hole-type electrodes.

5. An image sensor according to claim 3, wherein each of the sensor elements has six second hole-type electrodes.

6. An image sensor according to claim 3, wherein each of the sensor elements has eight second hole-type electrodes.

7. An image sensor according to claim 1, in which the reading unit has an IC substrate supporting the plate and having a plurality of ICs for amplifying electric signals generated from rays applied to any one of said plurality of sensor elements, and which further comprises a connecting layer provided between the plate and the IC substrate and electrically connecting the first hole-type electrodes or second hole-type electrodes of each sensor element; to electrodes of one IC.

8. An image sensor according to claim 7, wherein the connecting layer has a plurality of stud bumps provided on the electrodes of the ICs and a plurality of thin layers provided on tips of the stud bumps and electrically connected to the first electrodes or second electrodes of each of the sensor elements.

9. An image sensor according to claim 8, wherein the connecting layer has an insulating layer in which each of the stud bumps and each of the thin layers are embedded.

10. An image sensor according to claim 8, wherein each of the stud bumps is made of gold, and each of the thin layers is made of indium.

11. An image sensor according to claim 7, wherein the connecting layer has a plurality of multi-layer stud bumps provided on the electrodes of the ICs, each multi-stacked stud bump comprising at least two stud bumps laid one upon the other, and a plurality of thin layers provided on tips of the stud bumps and electrically connected to the first electrodes or second electrodes of each of the sensor elements.

12. An image sensor according to claim 11, wherein the connecting layer has an insulating layer in which each of the stud bumps and each of the thin layers are embedded.

13. An image sensor according to claim 11, wherein each of the stud bumps is made of gold, and each of the thin layers is made of indium.

14. An image sensor according to claim 1, wherein the semiconductor is a compound semiconductor.

15. The image sensor of claim 14, wherein the compound semiconductor is selected from the group consisting of CdTe and CdZnTe.

16. The image sensor of claim 1, wherein the first electrodes are formed by metallization of first holes provided in the plate and wherein the second electrodes are formed by metallization of second holes provided in the plate.

17. An image sensor apparatus comprising:
    a plurality of image sensors, each comprising;
    a plate made of semiconductor;
    first hole-type electrodes provided on the plate and arranged at predetermined intervals in a first direction and a second direction;
    second hole-type electrodes provided on the plate and arranged adjacent to the first hole-type electrodes, at predetermined intervals in the first direction and second direction;
    a voltage-applying unit which applies a first voltage to the first hole-type electrodes and a second voltage to the second hole-type electrodes; and
    a reading unit which reads an electric signal from a plurality of sensor elements, each comprising one of the first hole-type electrodes, some of the second hole-type electrodes adjacent to the first hole-type electrode and the semiconductor lying between said one of the first hole-type electrodes and said some of the second hole-type electrodes; and
    an output unit which outputs the electric signals read by of the reading units, independently of one another.

18. An image sensor apparatus according to claim 17, in which each of the reading units has an IC substrate supporting the plate and having a plurality of ICs for amplifying electric signals generated from the rays applied to any one of said plurality of sensor elements, and which further comprises a connecting layer provided between the plate and the IC substrate and electrically connecting the first hole-type electrodes or second hole-type electrodes of each sensor element; to electrodes of one IC.

19. An image sensor apparatus according to claim 18, wherein the connecting layer has an insulating layer in which each of the stud bumps and each of the thin layers are embedded.

20. An image sensor apparatus according to claim 17, wherein the first and second hole-type electrodes extend in a direction of thickness of the plate.

21. The image sensor of claim 17, wherein the first electrodes are formed by metallization of first holes provided in the plate and wherein the second electrodes are formed by metallization of second holes provided in the plate.

* * * * *